United States Patent
Sasaki et al.

(10) Patent No.: US 8,409,452 B2
(45) Date of Patent: Apr. 2, 2013

(54) THROUGH-HOLE FORMING METHOD, INKJET HEAD, AND SILICON SUBSTRATE

(75) Inventors: Keiichi Sasaki, Oita (JP); Yukihiro Hayakawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 437 days.

(21) Appl. No.: 12/197,499

(22) Filed: Aug. 25, 2008

(65) Prior Publication Data

US 2009/0073228 A1    Mar. 19, 2009

(30) Foreign Application Priority Data

Sep. 13, 2007    (JP) ................................. 2007-238387

(51) Int. Cl.
*H01B 13/00*    (2006.01)

(52) U.S. Cl. .................. 216/17; 216/2; 216/27; 216/41; 216/62; 216/83; 29/890.1

(58) Field of Classification Search .............. 216/2, 17, 216/27, 41, 62; 29/890.1
See application file for complete search history.

(56) References Cited

U.S. PATENT DOCUMENTS

| | | | |
|---|---|---|---|
| 5,236,547 A | | 8/1993 | Takahashi et al. |
| 5,972,794 A | | 10/1999 | Katakura |
| 6,143,190 A | * | 11/2000 | Yagi et al. .................. 216/27 |
| 6,374,482 B1 | * | 4/2002 | Mihara et al. .................. 29/611 |
| 6,378,996 B1 | | 4/2002 | Shimada et al. |
| 6,502,930 B1 | | 1/2003 | Shimada et al. |
| 6,800,902 B2 | * | 10/2004 | Shimotsusa .................. 257/341 |
| 6,875,365 B2 | * | 4/2005 | Watanabe et al. ............. 216/2 |
| 7,008,552 B2 | | 3/2006 | Ohkuma |
| 2003/0001234 A1 | * | 1/2003 | Fujii ............................ 257/552 |

FOREIGN PATENT DOCUMENTS

| | | |
|---|---|---|
| JP | 4-355909 A | 12/1992 |
| JP | 6-012963 A | 1/1994 |
| JP | 10-260523 A | 9/1998 |
| JP | 2001-205815 A | 7/2001 |
| JP | 2003-133581 A | 5/2003 |
| JP | 2004-034533 A | 2/2004 |

OTHER PUBLICATIONS

Office Action in Japanese Patent Application No. 2007-238387 (Feb. 20, 2012).

* cited by examiner

*Primary Examiner* — Shamim Ahmed
(74) *Attorney, Agent, or Firm* — Fitzpatrick, Cella, Harper & Scinto

(57) ABSTRACT

A through-hole forming method includes steps of forming a first impurity region (102a) around a region where a through-hole is to be formed in the first surface of a silicon substrate (101), the first impurity region (102) being higher in impurity concentration than the silicon substrate (101), forming a second impurity region (102b) at a position adjacent to the first impurity region (102a) in the depth direction of the silicon substrate (101), the second impurity region (102b) being higher in impurity concentration than the first impurity region (102a), forming an etch stop layer (103) on the first surface, forming an etch mask layer (104) having an opening on the second surface of the silicon substrate (101) opposite to the first surface, and etching the silicon substrate (101) until at least the etch stop layer (103) is exposed via the opening.

12 Claims, 6 Drawing Sheets

THROUGH-HOLE FORMING METHOD, INKJET HEAD, AND SILICON SUBSTRATE

BACKGROUND OF THE INVENTION

1. Field of the Invention

The present invention relates to a through-hole forming method, inkjet head, and silicon substrate.

2. Description of the Related Art

There has been studied a technique of forming a through-hole in a silicon substrate by isotropic or anisotropic etching and applying it to a variety of devices. This technique is also applied to formation of the ink supply port of an inkjet head.

When forming an inkjet head, especially when arranging many inkjet head printing elements on one substrate, the edge position of a through-hole on the etching end side is sometimes misaligned with the positions of an inkjet printing element and ink orifice. As a result, the printing characteristics of the nozzles of the inkjet head vary, greatly degrading the quality of a printed image.

To solve this, the present inventor has proposed a method of controlling the size of a through-hole by forming a heavily doped region around a region where the through-hole is formed in a silicon substrate (see Japanese Patent Laid-Open No. 2004-34533).

However, according to the method disclosed in Japanese Patent Laid-Open No. 2004-34533, when the heavily doped region is thin, the mechanical strength is poor. As shown in FIG. 4, warpage or a crack occurs under the stress between the heavily doped region and an etch stop layer. Thickening the heavily doped region can suppress generation of warpage, but decreases productivity and raises the cost.

SUMMARY OF THE INVENTION

The present invention has been made to overcome the conventional drawbacks, and has as its object to increase the positional accuracy of a through-hole and increase the mechanical strength around the through-hole.

According to the first aspect of the present invention, there is provided a through-hole forming method comprising steps of:

forming a first impurity region around a region where a through-hole is to be formed in a first surface of a silicon substrate, the first impurity region being higher in impurity concentration than the silicon substrate;

forming a second impurity region at a position adjacent to the first impurity region in a depth direction of the silicon substrate, the second impurity region being higher in impurity concentration than the first impurity region;

forming an etch stop layer on the first surface of the silicon substrate;

forming an etch mask layer on a second surface of the silicon substrate opposite to the first surface, the etch mask layer having an opening at a position corresponding to the through-hole to be formed; and etching the silicon substrate until at least the etch stop layer is exposed via the opening, thereby forming the through-hole.

According to the second aspect of the present invention, there is provided an inkjet head wherein a through-hole formed is formed as an ink supply port in accordance with a through-hole forming method as described above.

According to the third aspect of the present invention, there is provided a silicon substrate in which a through-hole is formed, the substrate comprising:

a first impurity region which is arranged around a region where the through-hole is formed in the silicon substrate, and is higher in impurity concentration than the silicon substrate; and a second impurity region which is arranged at a position adjacent to the first impurity region in a depth direction of the silicon substrate, and is higher in impurity concentration than the first impurity region.

According to the fourth aspect of the present invention, there is provided an inkjet head wherein that the inkjet head is formed on a silicon substrate as described above.

Further features of the present invention will become apparent from the following description of exemplary embodiments with reference to the attached drawings.

DESCRIPTION OF THE EMBODIMENTS

Preferred embodiments of the present invention will be described in detail below with reference to the accompanying drawings. The structures, arrangements, sizes, impurity types, and the like of respective portions set forth in the following description may not be construed to limit the scope of the invention to only them, unless otherwise specified.

First Embodiment

FIGS. 1A to 1G are sectional views for explaining a through-hole forming method according to the first preferred embodiment of the present invention.

Figure 1A:
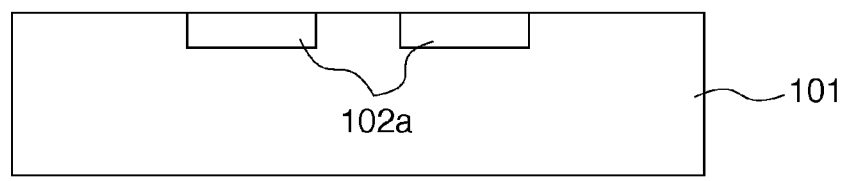
FIGS. 1A to 1G are sectional views for explaining a through-hole forming method according to the first preferred embodiment of the present invention.

In a step shown in FIG. 1A, a silicon substrate 101 having a <100> crystal plane is prepared. Also in this step, a first impurity region 102a higher in impurity concentration than the silicon substrate 101 is formed around a region where the inlet of a through-hole is to be formed in the first surface of the silicon substrate 101. The first impurity region 102a can be formed by, for example, forming a pattern by well-known photolithography, and doping an impurity into the silicon substrate 101 by an ion implantation technique using the pattern as a mask.

Figure 1B:
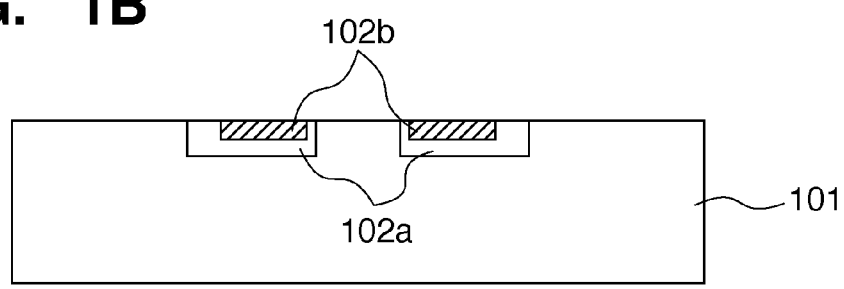

In a step shown in FIG. 1B, a second impurity region 102b higher in impurity concentration than the first impurity region 102a formed in the step shown in FIG. 1A is formed around the region where the inlet of the through-hole is to be formed. The second impurity region 102b is formed at a position adjacent to the first impurity region 102a in the depth direction of the silicon substrate 101.

Figure 1C:
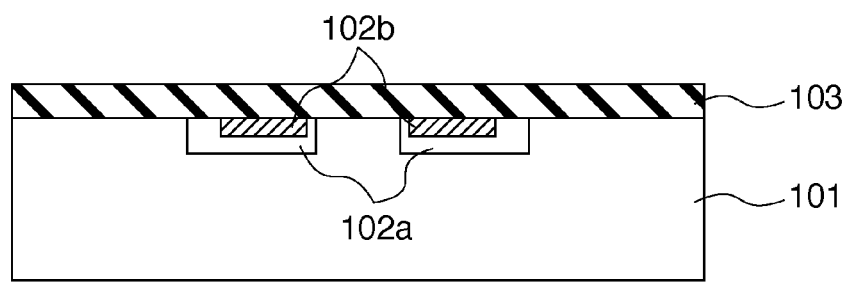

In a step shown in FIG. 1C, an etch stop layer 103 is formed on the second impurity region 102b (on the first surface) formed in the step shown in FIG. 1B.

Figure 1D:
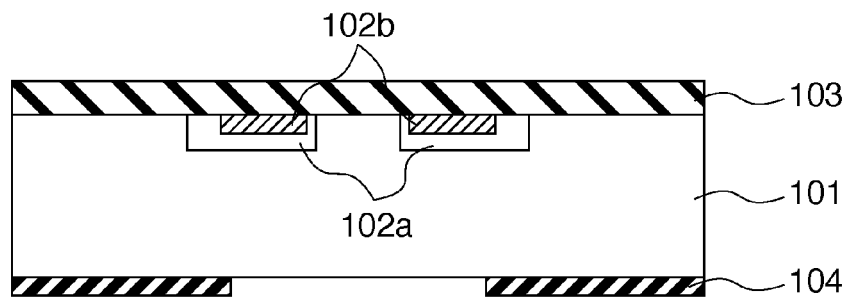

In a step shown in FIG. 1D, an etch mask layer 104 is formed on the second surface of the silicon substrate 101 opposite to the first surface in which the inlet of the through-hole is to be formed. The opening of the etch mask layer 104 corresponds to a region where the outlet of the through-hole is to be formed.

Figure 1E:
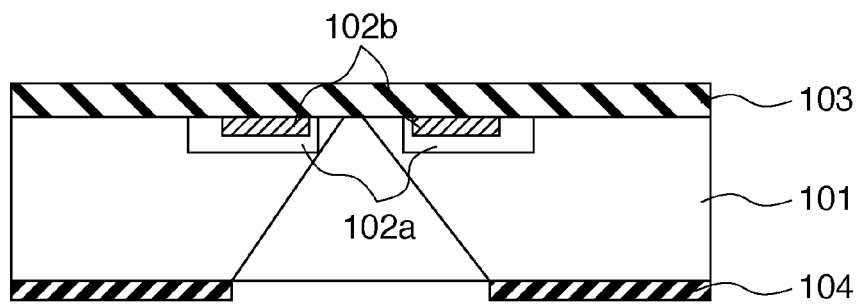

In a step shown in FIG. 1E, the silicon substrate 101 is dipped into an etching solution such as a strong alkaline solution to perform anisotropic etching using the etch mask layer 104 as a mask, thereby forming a through-hole. The opening of the etch mask layer 104 is arranged such that the through-hole etched until the etch stop layer 103 is exposed is surrounded by the first and second impurity regions 102a and 102b.

Figure 1F:
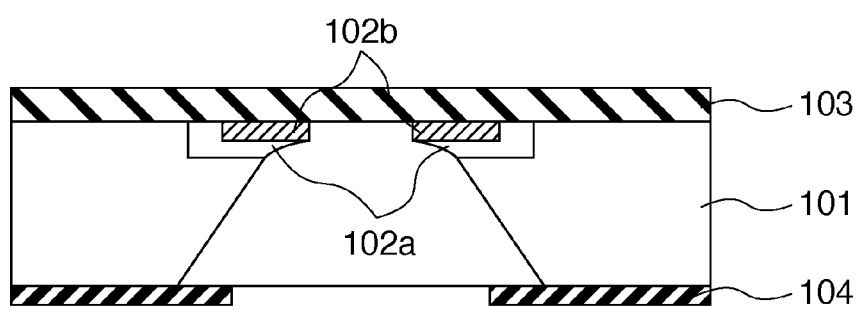

In a step shown in FIG. 1F, over-etching is done. Then, the through-hole widens by side etching and reaches the first and second impurity regions 102a and 102b. After side etching of the through-hole reaches the first and second impurity regions 102a and 102b, the side etching rate decreases depending on the impurity concentration. More specifically, the side etching rate drops to about ½ to ¹/₁₀. Assume that the size of the through-hole after extending through the silicon substrate 101 varies owing to variations in the thickness of the silicon substrate 101, a crystal defect, or the like. Even in this case, the side etching rate greatly decreases after over-etching is done to widen the through-hole to the first and second impurity regions 102a and 102b. This makes the size of the obtained through-hole almost constant, as shown in FIG. 1F.

Figure 1G:
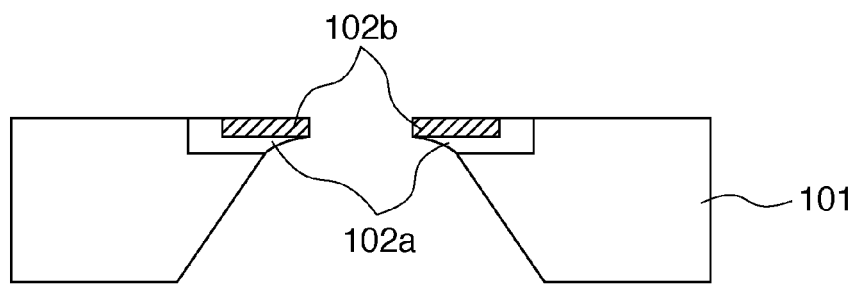

In a step shown in FIG. 1G, the etch stop layer 103 and etch mask layer 104 are properly removed from the silicon substrate 101 in which the size of the through-hole is controlled in the above-described way, completing the through-hole.

The etching rate is different between the first and second impurity regions 102a and 102b. For this reason, the thicknesses of the first and second impurity regions 102a and 102b are different from each other depending on the impurity concentration and etching time. This will be explained with reference to FIGS. 1E and 1F.

As shown in FIGS. 1E and 1F, the first and second impurity regions 102a and 102b are different in position in the depth direction of the silicon substrate 101. More specifically, the second impurity region 102b is positioned closer to the surface of the silicon substrate 101 than the first impurity region 102a. The first impurity region 102a is higher in impurity concentration than the silicon substrate 101, and the second impurity region 102b is higher in impurity concentration than the first impurity region 102a. For this reason, in the steps shown in FIGS. 1E and 1F, the etching rate of the silicon substrate 101 is highest, that of the first impurity region 102a is second highest, and that of the second impurity region 102b is lowest. If the through-hole is over-etched, the first impurity region 102a is etched less than the silicon substrate 101 and remains. The first impurity region 102a becomes thicker toward the outlet of the through-hole. The second impurity region 102b is hardly etched and remains. For the formed through-hole, the first impurity region 102a increases the mechanical strength of the second impurity region 102b, and the shape of the through-hole from the inlet to outlet can be almost smoothened. According to the first embodiment, the first impurity region 102a is lower in impurity concentration than the second impurity region 102b, so the through-hole can be easily formed by thermal diffusion or ion implantation. Thus, a through-hole forming method can be practiced with high productivity and low cost.

Even a conventional method of arranging only a heavily doped region in a silicon substrate can also increase the mechanical strength of a through-hole by thickening the heavily doped region. However, to make the heavily doped region thick, the high-concentration impurity must be thermally diffused for a long time, increasing the number of steps and prolonging the processing time. Since the difference in etching rate between the silicon substrate and the impurity region is large, the shape of the through-hole from the inlet to output does not become smooth, and a step may be generated.

The impurity concentration of the first impurity region 102a is preferably $1 \times 10^{18}$ cm$^{-3}$ or higher, and more preferably $1 \times 10^{19}$ cm$^{-3}$ or higher. If the impurity concentration becomes $7 \times 10^{19}$ cm$^{-3}$ or higher, the etching rate of the first impurity region 102a drops to about ¹/₁₀₀ of the etching rate of a general silicon substrate. The first embodiment can have an effect at even an impurity concentration of $1 \times 10^{18}$ cm$^{-3}$ or higher because it suffices to set the side etching rate of the first impurity region 102a slightly lower than that of the silicon substrate.

To set the etching rate of the second impurity region 102b much lower than that of a general silicon substrate, the impurity concentration of the second impurity region 102b is preferably $1 \times 10^{19}$ cm$^{-3}$ or higher, and more preferably $7 \times 10^{19}$ cm$^{-3}$ or higher.

The concentration of the silicon substrate 101 is not specifically limited, but is preferably about $1 \times 10^{13}$ cm$^{-3}$ to $1 \times 10^{16}$ cm$^{-3}$.

The first and second impurity regions 102a and 102b are preferably about 1 to 20 μm wide and 0.2 to 3 μm deep, but these values can be properly changed in accordance with the usage of the through-hole.

Examples of the impurities of the first and second impurity regions 102a and 102b are boron, phosphorus, arsenic, and antimony. Of these impurities, boron is desirable because the etching rate changes at low impurity concentration with respect to an alkaline chemical solution such as KOH. To improve the controllability of the etching rate, the impurities of the first and second impurity regions 102a and 102b are desirably of the same species.

The first and second impurity regions 102a and 102b can also be simultaneously formed in an impurity diffusion layer forming step when forming a general semiconductor device.

To more easily form a through-hole by low-energy ion implantation, the second impurity region 102b is preferably positioned closer to the first surface (on the inlet side of the through-hole) of the silicon substrate 101 than the first impurity region 102a. This arrangement suppresses the progress of side etching by anisotropic etching on the substrate surface, and increases the processing accuracy. However, the second impurity region 102b can be reinforced as long as at least part of the first impurity region 102a is arranged at a position different from that of the second impurity region 102b in the depth direction of the silicon substrate 101. Hence, the positional relationship between the first and second impurity regions 102a and 102b in the depth direction of the silicon substrate 101 is not limited to the arrangement shown in FIGS. 1A to 1G.

Even if the second impurity region 102b contacts the etching solution, etching hardly progresses. However, when the second impurity region 102b contacts the etching solution, the surface of the second impurity region 102b is greatly roughened and may generate dust. To prevent this, at least part of the first impurity region 102a is preferably arranged closer than the second impurity region 102b to the region where the through-hole is formed. In this case, the first impurity region 102a is etched first by anisotropic etching. The time during which the second impurity region 102b contacts the etching solution becomes short, suppressing the roughening of the surface of the second impurity region 102b. However, a position of the first impurity region 102a that is parallel to the surface of the silicon substrate 101 is not limited to only the arrangement shown in FIGS. 1A to 1G.

When the interface state is formed at the interface between the etch stop layer 103 and the silicon substrate 101, and a damaged layer is formed by processing or the like, side etching in anisotropic etching progresses quickly. In this case, no sufficient effect may be obtained even if the first and second impurity regions 102a and 102b are formed. Thus, a thermal oxide film is preferably formed at the interface between the etch stop layer 103 and the first and second impurity regions 102a and 102b because it suppresses side etching. This is more effective when at least part of the second impurity region 102b for which side etching needs to be suppressed is in contact with the thermal oxide film.

The etch stop layer 103 suffices to have a low etching rate with respect to the etching solution and have high selectivity with respect to the silicon substrate. As the etch stop layer 103, various materials such as a silicon nitride film and Ta are selectable. In particular, a plasma CVD oxide film is generally used in even the LSI manufacturing process, and is effective when a through-hole, elements used in an LSI, and the like are simultaneously formed.

The through-hole forming method according to the first embodiment is preferably adopted for an inkjet head having an ink supply port.

Second Embodiment

FIGS. 2A to 2D are sectional views for explaining a through-hole forming method according to the second preferred embodiment of the present invention. The through-hole forming method according to the second embodiment is a partial modification to the through-hole forming method according to the first embodiment. More specifically, the second impurity region 102b is buried in part of the first impurity region 102a in the first embodiment. In the second embodiment, a first impurity region 202a is arranged without burying a second impurity region 202b. The remaining arrangement is the same as that in the first embodiment. In FIGS. 2A to 2D, steps corresponding to FIGS. 1A to 1C are omitted, and steps start from one shown from FIG. 2A corresponding to FIG. 1D.

Figure 2A:
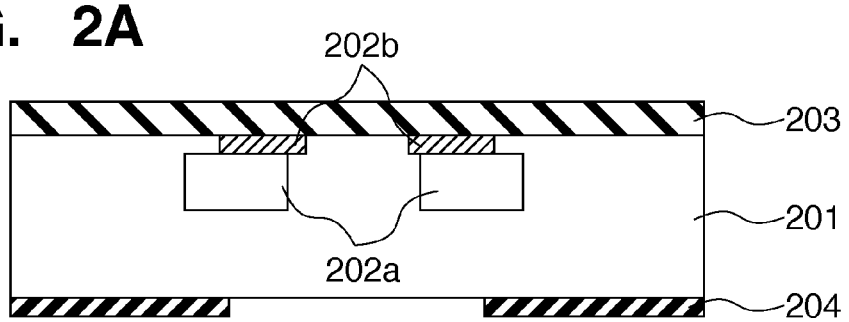
FIGS. 2A to 2D are sectional views for explaining a through-hole forming method according to the second preferred embodiment of the present invention.

In a step shown in FIG. 2A, a first impurity region 202a 4 μm wide, 1 μm deep, and 0.8 μm thick is formed with an inner diameter of 101 μm in a silicon substrate 201 having a <100> crystal plane (thickness: 625 μm). A second impurity region 202b 3 μm wide and 0.2 μm deep is formed with an inner diameter of 100 μm at a position closer to the substrate surface than the first impurity region 202a. As an etch stop layer 203, an LP—SiN film is formed at 2,500 Å. The etch stop layer 203 is arranged on the second impurity region 202b which is arranged at a position more inward than the first impurity region 202a and closer to the first surface (on the inlet side of a through-hole) of the substrate. Boron (B) is diffused as an impurity in the first impurity region 202a at a concentration of $1\times10^{18}$ cm$^{-3}$. Also, Boron (B) is diffused as an impurity in the second impurity region 202b at a concentration of $1\times10^{19}$ cm$^{-3}$. A mask 204 (e.g., SiO$_2$ and 4,000 Å) for anisotropic etching is arranged on the second surface (on the outlet side of the through-hole) of the silicon substrate 201.

Figure 2B:
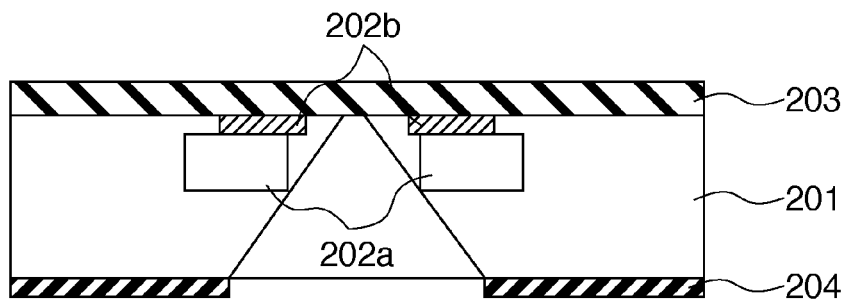

In a step shown in FIG. 2B, the silicon substrate 201 is anisotropically etched. For example, the entire silicon substrate 201 is dipped into a 22% aqueous TMAH solution, and anisotropically etched at a temperature of 83° C. for 1,000 min. The etching rate under these conditions is about 39 to 40 μm/h. The substrate surface is preferably protected with a jig so as to prevent the aqueous TMAH solution from entering the substrate. Anisotropic etching forms a through-hole which extends through the silicon substrate 201 and has a formation width of 80 to 95 μm.

Figure 2C:
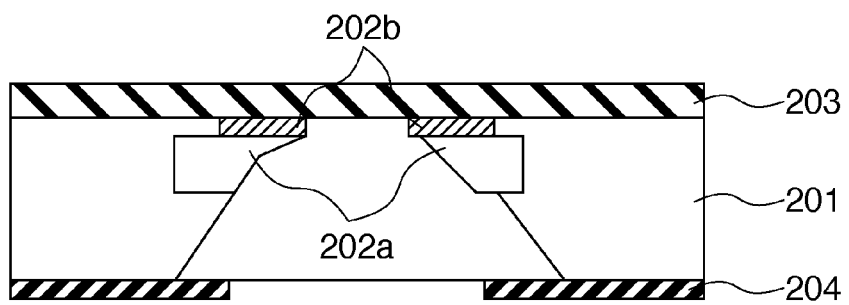

In a step shown in FIG. 2C, anisotropic etching is performed again in order to further over-etch the silicon substrate 201. For example, when anisotropic etching is done for 30 min, the side etching rate on one side of the through-hole is about 5 μm/h. Side etching in over-etching widens the through-hole. Near the inlet of the through-hole, the second impurity region 202b stops etching. The width of the through-hole becomes 100 to 101 μm.

Figure 2D:
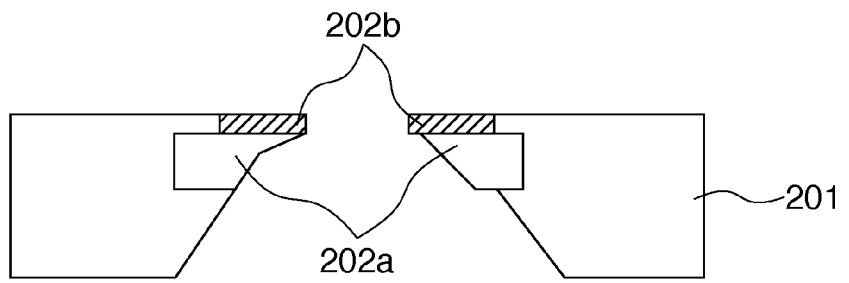

In a step shown in FIG. 2D, the etch stop layer 203 and etch mask layer 204 are properly removed, completing the through-hole.

Note that the second embodiment adopts TMAH as a silicon substrate etching solution, but the present invention is not limited to this and can use KOH or the like.

As described above, in the second embodiment, the first impurity region is arranged deeper in the substrate than in the first embodiment. In this arrangement, the first impurity region can increase the mechanical strength of the second impurity region, and the shape of the through-hole from the inlet to outlet can be more smoothened.

Third Embodiment

FIGS. 3A to 3H are sectional views showing an example of applying the through-hole forming method according to the first or second embodiment to formation of the ink supply port of an inkjet head as the third preferred embodiment of the present invention. As shown in FIGS. 3A to 3H, a plurality of electrothermal transducers, and a plurality of switching elements for supplying a current to the electrothermal transducers are generally integrated on an inkjet head substrate according to the third embodiment.

Figure 3A:
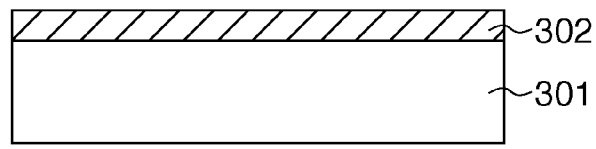
FIGS. 3A to 3H are sectional views showing an application example of formation of the ink supply port of an inkjet head according to the third preferred embodiment of the present invention.

In a step shown in FIG. 3A, a p-type silicon substrate 301 (e.g., thickness: 625 μm) having a <100> crystal plane is prepared. An n-type impurity is selectively doped to form an n-type well region 302 in the surface of the p-type silicon substrate 301. The n-type well region 302 may also be formed in the entire surface of the p-type silicon substrate 301. When forming the n-type well region 302 in the entire surface of the p-type silicon substrate 301, the n-type well region 302 can be formed by epitaxial growth.

Figure 3B:
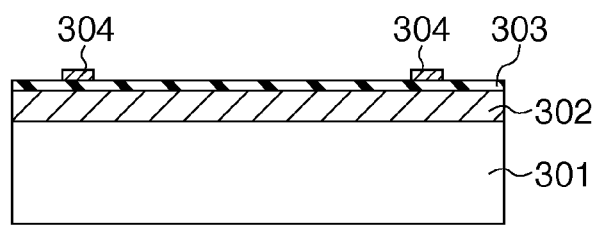

In a step shown in FIG. 3B, a gate oxide film (gate insulation film) 303 about 50 nm thick is formed, and polysilicon is deposited to a thickness of about 300 nm on the gate oxide film 303. For example, phosphorus is doped into polysilicon to have a desired wiring resistance value. Then, in this step, a pattern is formed by well-known photolithography, and the polysilicon film is etched, forming a gate electrode 304 of a MIS-type field effect transistor.

Figure 3C:
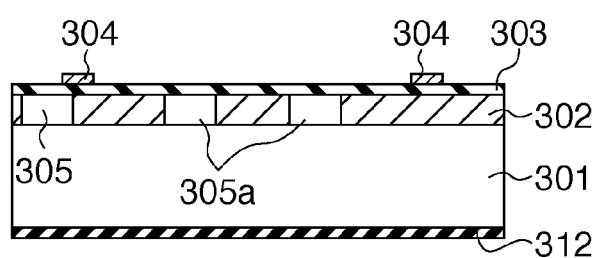

In a step shown in FIG. 3C, a pattern is formed by well-known photolithography, forming an ion implantation mask (not shown) from a photoresist. In this step, the gate electrode 304 is also used as an ion implantation mask, and ions of a p-type impurity (e.g., boron) are selectively implanted. Then, in this step, for example, annealing is performed at 1,100° C. for 60 min, forming an impurity region 305, and a first impurity region 305a around a region where a through-hole is to be formed. Also in this step, annealing is done before and after ion implantation of the p-type impurity, forming a mask 312 (e.g., SiO$_2$ and 4,000 Å) for anisotropic etching on the second surface (on the outlet side) of the silicon substrate 301. The impurity region 305 is a base region about 2.2 μm deep where elements, wiring, and the like are electrically insulated. The concentration of the base region preferably falls within the range of about $1\times10^{15}$ cm$^{-3}$ to $1\times10^{19}$ cm$^{-3}$ on the uppermost surface.

Figure 3D:
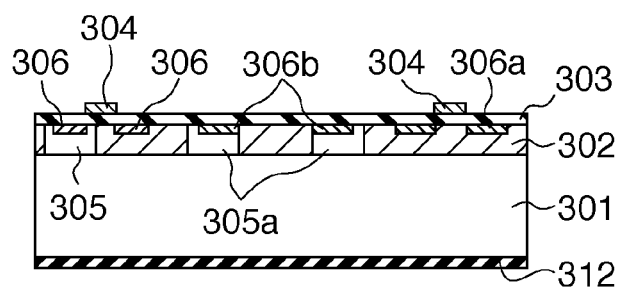

In a step shown in FIG. 3D, for example, arsenic ions are implanted using the gate electrode 304 and photoresist as a mask, forming an NSD region 306. Also in this step, for example, boron ions are implanted using the gate electrode 304 and photoresist as a mask, forming a PSD region 306a, and a second impurity region 306b around the region where the inlet of the through-hole is to be formed. Then, in this step, for example, annealing is performed at 950° C. for 30 min, activating the NSD region 306, PSD region 306a, and impurity region 306b.

Figure 3E:
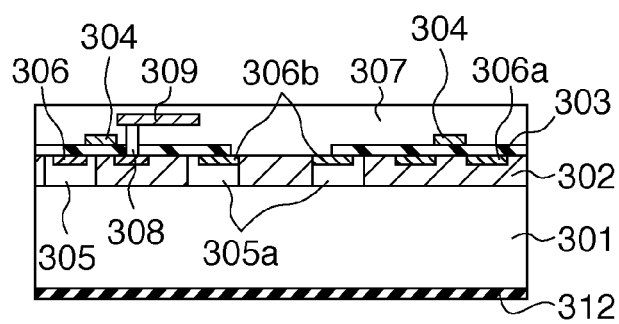

In a step shown in FIG. 3E, for example, an oxide film is deposited by plasma CVD, forming an interlayer insulation film 307. The interlayer insulation film 307 also functions as an etch stop layer. In this step, a contact hole 308 is formed, and a conductor is deposited and patterned, forming wiring. In wiring formation, multilayer wiring is formed, as needed. In this step, an electrothermal transducer 309 is formed on the p-type silicon substrate 301 by a well-known thin film formation process. As the electrothermal transducer 309, for example, TaSiN is available.

Figure 3F:
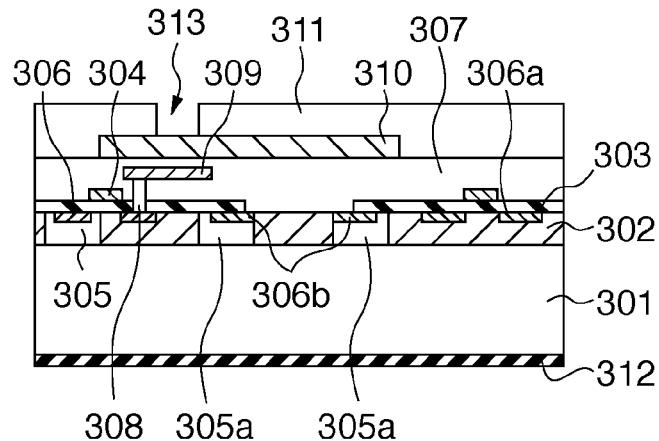

In a step shown in FIG. 3F, a positive resist 310 serving as the mold of an ink channel is formed by patterning on the p-type silicon substrate 301. In this step, a negative resist 311 is applied onto the ink channel, and an ink orifice 313 is formed by patterning.

Figure 3G:
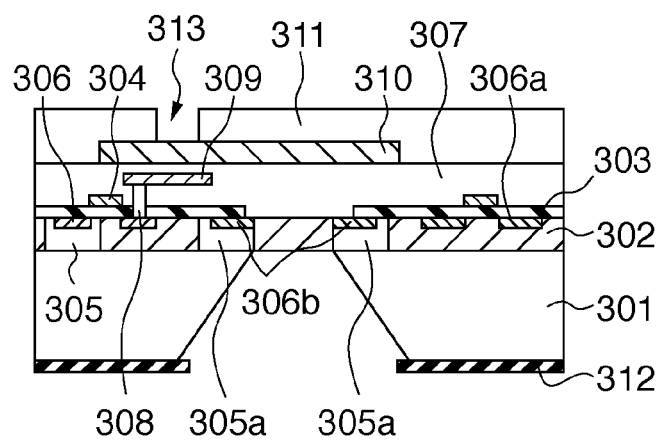

In a step shown in FIG. 3G, the entire substrate is dipped into a 22% aqueous TMAH solution, and anisotropically etched at a temperature of 83° C. for 990 min. The substrate surface is preferably protected with a jig so as to prevent the aqueous TMAH solution from entering the substrate. FIG. 3G shows the sectional shape of the substrate at the end of anisotropic etching.

Figure 3H:
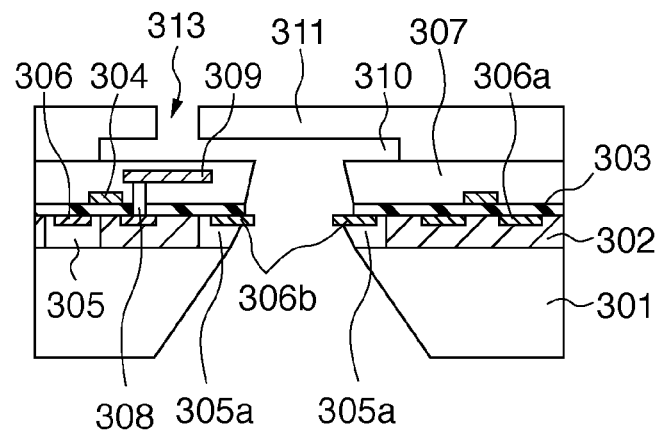
Figure 4:
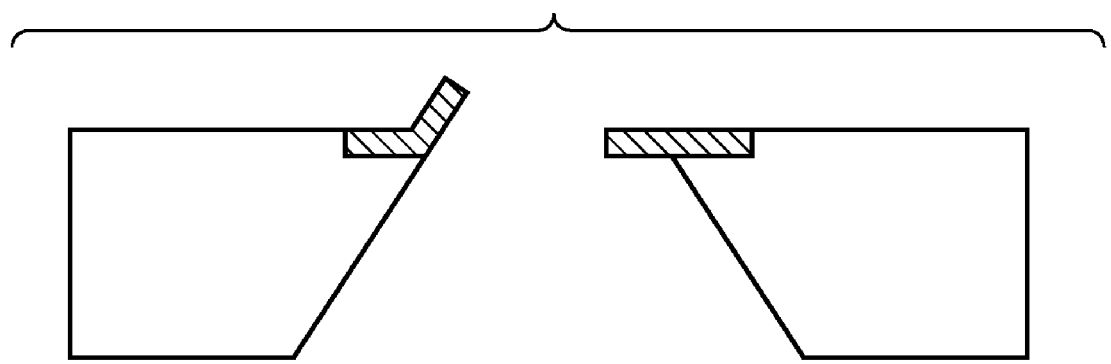
FIG. 4 is a sectional view for explaining a conventional through-hole forming method.

In a step shown in FIG. 3H, while the substrate surface is protected, the interlayer insulation film 307 serving as an etch stop layer is etched with, for example, HF from the second surface (outlet side) of the silicon substrate 301. As a result, the through-hole is completed in the silicon substrate 301. Then, in this step, the positive resist 310 serving as the mold of an ink channel is removed. The mask 312 is properly removed, completing the inkjet head.

All chips each having the above-mentioned inkjet head were microscopically examined for a crack and abnormality of silicon around the through-hole to confirm that no defect was generated. The width of the through-hole was measured to find out that it fell within the range of 102 to 106 µm and the through-hole was formed at high precision.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-238387, filed Sep. 13, 2007, which is hereby incorporated by reference herein in its entirety.

What is claimed is:

1. A through-hole forming method comprising steps of:
    forming a first impurity region around a region where a through-hole is to be formed in a first surface of a silicon substrate, the first impurity region being higher in impurity concentration than the silicon substrate;
    forming a second impurity region at a position adjacent to the first impurity region in a depth direction of the silicon substrate such that the first impurity region has a thickness greater than the second impurity region, the second impurity region being higher in impurity concentration than the first impurity region, wherein the step of forming the second impurity region is performed separately from the step of forming the first impurity region;
    forming a first layer on the first surface of the silicon substrate;
    forming an etch mask layer on a second surface of the silicon substrate opposite to the first surface, the etch mask layer having an opening at a position corresponding to the through-hole to be formed; and
    etching the silicon substrate until at least the first layer is exposed via the opening, thereby forming the through-hole.

2. The method according to claim 1, further comprising a step of removing the first layer after the etching step.

3. The method according to claim 1, wherein that the second impurity region is arranged closer to the first surface of the silicon substrate than the first impurity region.

4. The method according to claim 3, wherein that at least part of the first impurity region is arranged closer to the through-hole than the second impurity region.

5. The method according to claim 1, wherein at least part of the second impurity region is in contact with a thermal oxide film.

6. The method according to claim 1, further comprising a step of forming a semiconductor device, the step of forming the semiconductor device including a step of forming an impurity diffusion layer of the semiconductor device, wherein the step of forming the impurity diffusion layer is performed simultaneously with the step of forming the first impurity region or the step of forming the second impurity region.

7. The method according to claim 1, wherein the step of etching the silicon substrate includes wet etching of the silicon substrate.

8. The method according to claim 1, wherein the step of etching the silicon substrate is performed by dipping the silicon substrate into an etching solution.

9. The method according to claim 8, wherein the etching solution is an alkaline solution and anisotropic etching is performed.

10. The method according to claim 9, wherein the etching solution is a TMAH solution or a KOH solution.

11. The method according to claim 1,
    wherein the step of forming the first impurity region includes a step of doping the silicon substrate with impurities, and a step of annealing the silicon substrate doped with the impurities; and
    wherein the step of forming the second impurity region is performed after the step of annealing the silicon substrate.

12. The method according to claim 1, wherein an inner diameter of the second impurity region is smaller than that of the first impurity region.

* * * * *